United States Patent [19]

Shinkawa et al.

[11] 4,307,352
[45] Dec. 22, 1981

[54] MICRO-STRIP OSCILLATOR WITH DIELECTRIC RESONATOR

[75] Inventors: Keiro Shinkawa; Chuichi Sodeyama, both of Yokohama, Japan

[73] Assignee: Hitachi, Ltd., Tokyo, Japan

[21] Appl. No.: 84,458

[22] Filed: Oct. 12, 1979

[30] Foreign Application Priority Data

Oct. 17, 1978 [JP] Japan ................................ 53-127713

[51] Int. Cl.³ ............................ H03B 5/18; H03B 9/14
[52] U.S. Cl. ............................ 331/99; 331/107 SL; 331/117 D; 333/219
[58] Field of Search ...................... 331/96, 99, 107 SL, 331/117 D; 333/222, 223, 219, 238, 246, 247, 227

[56] References Cited
U.S. PATENT DOCUMENTS 3,840,828 10/1974 Linn et al. ...................... 333/238 X
4,019,161 4/1977 Kimura et al. .................. 333/222 X
4,187,476 2/1980 Shinkawa et al. ................ 331/99 X

FOREIGN PATENT DOCUMENTS 54-144856 11/1979 Japan ............................ 331/107 SL

*Primary Examiner*—Siegfried H. Grimm
*Attorney, Agent, or Firm*—Craig and Antonelli

[57] ABSTRACT

A microwave oscillator circuit comprises a micro-strip line having a substrate of a dielectric material, a semiconductor such as a Gunn diode or an FET, and a dielectric resonator connected to the micro-strip line as a resonator circuit. A hole is formed in the substrate beside the micro-strip line, or the substrate is cut off to provide a recess. Through this hole or recess, as the case may be, the dielectric resonator is directly secured to the metal casing supporting the micro-strip line on the opposite side thereof or to the grounding conductor of the micro-strip line.

3 Claims, 10 Drawing Figures

MICRO-STRIP OSCILLATOR WITH DIELECTRIC RESONATOR

FIELD OF THE INVENTION

This invention relates to a microwave oscillator using a micro-strip line or more in particular to a microwave oscillator having an improved arrangement of a micro-strip line and a dielectric resonator.

DESCRIPTION OF THE PRIOR ART

Prior to explanation of embodiments of the invention, typical examples of the conventional microwave oscillator will be described below.

Figure 1:
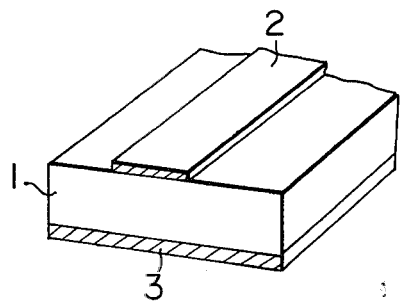
FIG. 1 shows an example of the basic construction of a general micro-strip line.
Figure 2:
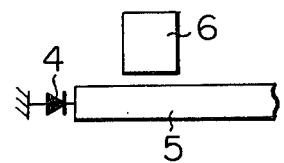
FIGS. 2 and 3 show circuit diagrams showing examples of an oscillator circuit using the micro-strip line in FIG. 1.

A general construction of the micro-strip line is shown in FIG. 1. Reference numeral 1 shows a dielectric substrate, on the upper side of which a strip conductor 2 is formed, and a grounding conductor 3 is formed on the back side of the dielectric substrate 1. The strip conductor 2 and the grounding conductor 3 make up a parallel line for transmission of a signal. The grounding conductor 3 may alternatively be provided by a metal casing in which the dielectric substrate is arranged in close contact therewith, instead of being attached to the back side of the dielectric substrate 1. In such a case, only the strip conductor is formed on the upper side of the dielectric substrate. A Gunn diode or a field effect transistor (FET) is mounted on this micro-strip line, and a dielectric resonator of high quality factor is arranged at the side of the micro-strip line, thus making up a microwave oscillator. FIG. 2 shows an example of the construction of a microwave oscillator having a Gunn diode, and FIG. 3 that of a microwave oscillator having an FET.

In FIG. 2, an output line 5 formed by a micro-strip line of a Gunn diode 4 is coupled to a dielectric resonator 6, and a bias voltage is supplied to the Gunn diode by bias means not shown, thus making up an oscillator. In order to achieve the maximum reflection at the resonance frequency of the dielectric resonator 6, the distance between the Gunn diode 4 and the coupling position of the dielectric resonator 6 is selected in such a manner as to form a self-oscillation loop between the Gunn diode 4 and the dielectric resonator 6, thus attaining oscillation at the resonance frequency of the dielectric resonator 6. This dielectric resonator is generally made of a material of Ti group, and has a resonance frequency depending on the dielectric constant and outline dimension thereof. At the present, such a dielectric resonator having quality factor of about 3000 to 5000 is sold on the market.

Figure 3:
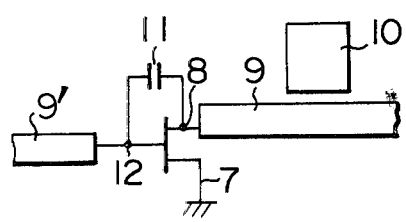

In FIG. 3, the dielectric resonator 10 is arranged on the side of an output line 9 made of a micro-strip line connected to a drain 8 of an FET with a source 7 thereof grounded. As a result, the amount of feedback between the drain 8 and a gate 12 of the FET connected by a feedback capacitor 11 is maximum at the resonance frequency of the dielectric resonator 10, at which oscillation occurs. Although not shown in FIG. 3, a bias voltage is applied to each electrode of the FET by a bias means. Now, the gate 12 of the FET is connected to an input line 9' made of a micro-strip line.

As noted from the construction of the oscillators shown in FIGS. 2 and 3, the mere arrangement of the dielectric resonator in the vicinity of the micro-strip line makes it possible to form a resonator circuit of high quality factor, thus realizing a stable oscillator.

Figure 4:
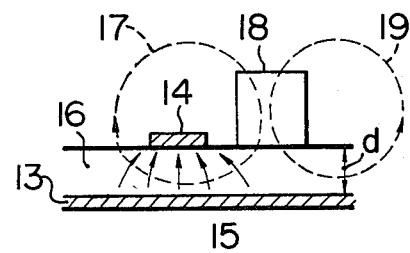
FIG. 4 is a sectional view for explaining the coupling condition between the strip conductor and the dielectric resonator of an oscillator circuit.

An example of a conventional construction in which the micro-strip line and the dielectric resonator are coupled with each other is shown in FIG. 4. An electric field 16 is concentrated between a strip conductor 14 on the upper side of a dielectric substrate 13 and a grounding conductor 15 on the back side thereof, so that a signal is transmitted in the micro-strip line mode of a magnetic field 17 generated around the strip conductor 14. When a dielectric resonator 18 is disposed beside this micro-strip line, a magnetic field 19 coupled with the transmission magnetic field 17 is generated. Thus the micro-strip line is coupled with the dielectric resonator 18, so that the characteristic of a band-stop filter is attained in which the maximum attenuation occurs at the resonance frequency fr of the dielectric resonator, thereby forming a resonator circuit.

Figure 5:
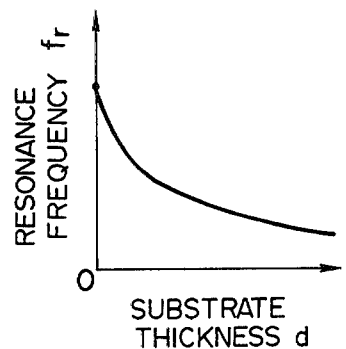
FIG. 5 is a graph showing the relation between the resonance frequency of the oscillator circuit and the thickness of the substrate of the micro-strip line in the arrangement of the dielectric resonator shown in FIG. 4.

The construction of FIG. 4 is very simple since the dielectric resonator 18 is merely fixed by a bonding agent or the like on the dielectric substrate 13 in the vicinity of the micro-strip line. In view of its simplicity, this construction is widely used. The resonance frequency fr of the dielectric resonator 18 depends on the distance therefrom to the surrounding conductor wall. In the construction of FIG. 4, the resonance frequency changes with the distance between the dielectric reasonator 18 and the grounding conductor 15, i.e., the thickness d of the dielectric substrate, as shown in FIG. 5. If the grounding conductor is positioned nearer to the dielectric resonator 18 by reducing the thickness of the dielectric substrate, the resonance frequency fr increases. Therefore, even if thickness of the dielectric substrate is determined to be d at normal room temperature, the thickness d changes with the change in room temperature in accordance with the thermal expansion of the substrate material, with the result that if the coefficient of thermal expansion of the substrate material is constant, the resonance frequency fr changes at a substantially fixed gradient with the change in room temperature. In order to dampen the variation in oscillation frequency of the oscillator with the change in room temperature, a dielectric resonator made of material whose temperature coefficient is positive is used for compensating the negative temperature coefficient of the elements used in the oscillator and the negative temperature coefficient of the resonance frequency in accordance with the degree of the thermal expansion of the substrate material.

Figure 6:
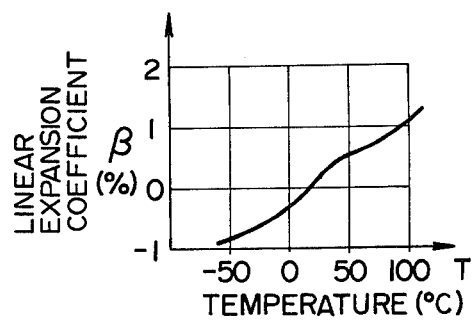
FIG. 6 is a graph showing an example of the temperature characteristic of the coefficient of the linear expansion of teflon.

Well known conventional materials of the dielectric substrate for the micro-strip line used with microwave include quartz, sapphire or ceramics. Recentry, however, teflon or teflon glass fiber with teflon as a main component, or territe is considered as material of the dielectric substrate due to their low cost and their high workability. Since the substrates made of these high polymer materials have high coefficients of thermal expansion as compared with the conventional substrates, therefore, the positive temperature coefficient of the dielectric resonator must be considerably high to compensate the high coefficient of thermal expansion of the substrate. This leads to the disadvantage that the variations of the gradients of temperature characteristics of the dielectric resonators increase, thus varying the stabilities of the oscillators with respect to temperature for each oscillator. Also, teflon has a transition region at temperature area of 18.3° C. to 25° C., in which a sudden change in volume of 1 to 2% occurs. In other words, as shown in FIG. 6, the linear expansion coefficient $\beta$ of teflon changes greatly at about 20° C., at which the linearity of the thermal expansion coefficient is lost.

Figure 7:
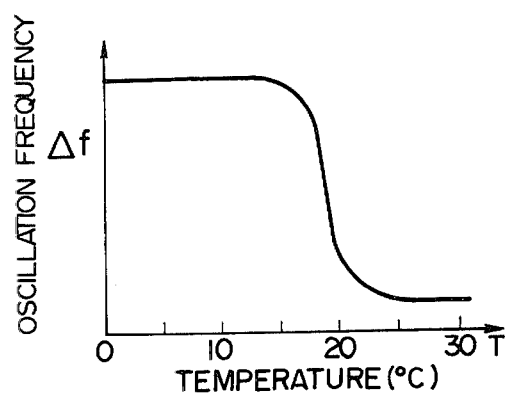
FIG. 7 is a graph showing an example of the measurement of the temperature characteristic of the oscillation frequency of the oscillator comprising a micro-strip line using a teflon substrate.

In view of the fact that the thickness of the teflon substrate undergoes a sudden change at about 20° C., as mentioned above, the oscillator having the substrate of teflon greatly changes in oscillation frequency $\Delta f$ at about 20° C. as shown in FIG. 7. An example of measurement of the FET oscillator with an oscillation frequency of 11 GHz tested with a teflon substrate is shown in FIG. 7, which shows a frequency change of about 600 KHz in the temperature range from 15° C. to 20° C. As will be seen from the foregoing description, the oscillator having the substrate of a high polymer material has the disadvantage that the oscillation frequency is unstable with the change in room temperature on the one hand and that the oscillation frequency greatly strays at about the normal temperature where it is used most often on the other hand.

SUMMARY OF THE INVENTION

Accordingly, it is an object of the present invention to provide a microwave oscillator whose resonance frequency little changes even in the case where a dielectric substrate whose volume changes greatly with the change in temperature is used as the micro-strip substrate, and whose oscillation frequency is stable with the change in temperature.

In order to achieve the above objects, according to the present invention, there is provided a microwave oscillator in which a dielectric resonator to be coupled with a strip conductor of a strip line is disposed directly on a grounding conductor or a metal casing through a hole formed in or by cutting off the portion of the dielectric substrate where the dielectric resonator is to be arranged, without arranging the dielectric resonator on the dielectric substrate. According to this arrangement, even if the dielectric substrate expands by the increase of temperature, the distance between the dielectric resonator and the grounding conductor remain constant, so that only the temperature coefficient of the dielectric resonator is taken in consideration for the stability of the oscillation frequency. Thus the oscillation frequency is not affected by the change in thickness of the dielectric substrate due to the change in temperature, and therefore the oscillation frequency has a high stability against temperature even if a low-cost dielectric substrate is used.

DESCRIPTION OF THE PREFERRED EMBODIMENTS

Figure 8:
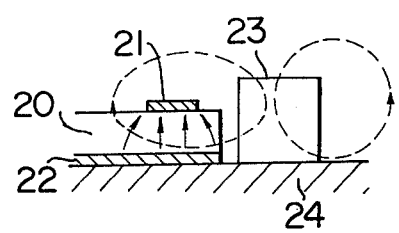
FIG. 8 is a sectional view showing the coupling condition of a dielectric resonator and a strip conductor of a microwave oscillator according to the present invention.

The present invention will be described in detail below with reference to the accompanying drawings. FIG. 8 shows the connection condition of a dielectric resonator and a micro-strip line of the teflon substrate used in a microwave oscillator according to this invention. A teflon substrate 20 on the upper and back sides of which a strip conductor 21 and a grounding conductor 22 are respectively provided to make up a micro-strip line. The portion of the dielectric substrate 20 beside the strip conductor 21 is partially cut off along the conductor 21, so that a dielectric resonator 23 is placed in the cut portion and directly on a metal case plate 24. As an alternative, the dielectric substrate 20 may be cut off to leave the grounding conductor 22, so that the dielectric resonator 23 may be placed directly on the exposed grounding conductor 22. The micro-strip line having the dielectric resonator 23 arranged in this way is combined with a semiconductor element such as a Gunn diode or an FET in the manner similar to the conventional construction shown in FIG. 2 or 3, thus making up an oscillator.

The dielectric resonator is coupled with the micro-strip line, with the result that the resonance frequency of the dielectric resonator is not affected by the change in thickness of the substrate in accordance with the coefficient of linear expansion of the teflon used as the substrate, thus improving the stability of the oscillation frequency of the oscillator against temperature changes. Further, since the oscillation frequency of the oscillator is arranged without regard to the thickness of the substrate, variation of the oscillation frequency is prevented which otherwise might occur due to variation in substrate thickness in the processes of manufacture of a multiplicity of similar oscillators.

Figure 9:
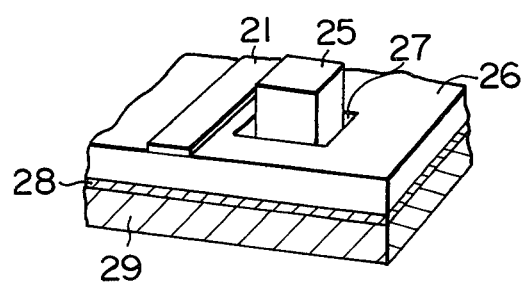
FIG. 9 is a perspective view showing an example of the arrangement of the dielectric resonator in a microwave oscillator according to the present invention.
Figure 10:
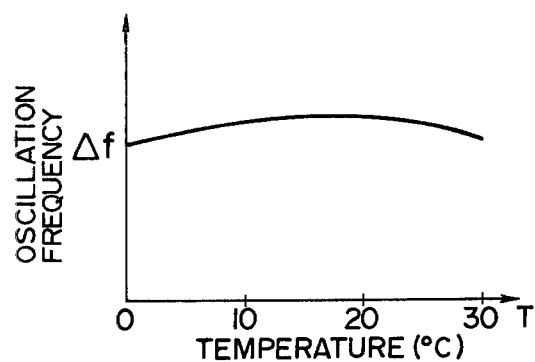
FIG. 10 is a graph showing an example of the measurement of the temperature characteristic of the oscillation frequency of a oscillator according to the present invention.

In similar fashion, the same effect as in FIG. 8 is obtained by the arrangement of FIG. 9 where a dielectric resonator 25 is fixed directly on a grounding conductor 28 or a metal casing 29 through a hole 27 formed in a teflon substrate 26. An example of the temperature characteristics of the FET oscillator of the teflon substrate having the construction shown in FIG. 9 is illustrated in FIG. 10. The oscillation frequency is 11 GHz, which fails to change suddenly with temperature change but changes by about only 100 KHz in the temperature range from 0° C. to 30° C., thus attaining a superior stability.

In this embodiment, the present invention is explained with an example using the teflon substrate. Since the present invention is intended to provide a construction not affected by the thickness of the substrate, however, the substrate material is not limited to the teflon but other type of materials may be used with equal effect.

It will be understood from the foregoing description that according to the present invention, the dielectric resonator is placed directly on the metal casing or grounding conductor of the micro-strip line for connection with the micro-strip line, and therefore the variation among resonance frequencies of the oscillators is reduced, thus achieving the characteristics stable against temperature changes.

We claim:

1. A microwave oscillator comprising a micro-strip line and a dielectric resonator of a dielectric material disposed in proximity to said line, wherein a selected one of a recess and a hole is formed in proximity to part of a strip conductor and extends from the side of a strip line substrate having said strip conductor to the opposite side thereof having a grounding conductor, said dielectric resonator being arranged in said selected one of a recess and a hole and made of a dielectric material secured to said grounding conductor.

2. A microwave oscillator comprising a micro-strip line and an oscillation semiconductor element combined with said micro-strip line, said microwave oscillator further comprising:

a dielectric substrate with a strip conductor arranged on the upper side thereof and with a grounding conductor plate arranged on the opposite side thereof, said dielectric substrate including a selected one of a recess and a hole formed in proximity to part of said strip conductor and extending to said grounding conductor plate on the opposite side of said substrate; and a dielectric resonator arranged in said selected one of said recess and said hole of said dielectric substrate and secured to said grounding conductor plate, said dielectric resonator being coupled to a magnetic field of said strip conductor.

3. A microwave oscillator comprising a micro-strip line and an oscillation semiconductor element combined with said micro-strip line, said microwave oscillator further comprising:

a dielectric substrate with a strip conductor arranged on the upper side thereof and with a metal case plate covering the opposite side thereof, said dielectric substrate including a selected one of a recess and a hole formed in proximity to part of said strip conductor and extending to said metal case plate on the opposite side of said substrate; and a dielectric resonator arranged in said selected one of said recess and said hole of said dielectric substrate and secured to said metal case plate, said dielectric resonator being coupled to a magnetic field of said strip conductor.

* * * * *